(12) United States Patent
Sasaki

(10) Patent No.: US 8,912,084 B2
(45) Date of Patent: Dec. 16, 2014

(54) SEMICONDUCTOR DEVICE

(71) Applicant: Kabushiki Kaisha Toshiba, Tokyo (JP)

(72) Inventor: Fumio Sasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/773,330

(22) Filed: Feb. 21, 2013

(65) Prior Publication Data

US 2013/0334647 A1    Dec. 19, 2013

(30) Foreign Application Priority Data

Jun. 14, 2012  (JP) ................. 2012-134913

(51) Int. Cl.
| | | |
|---|---|---|
| H01L 21/28 | (2006.01) | |
| H01L 29/68 | (2006.01) | |
| H01L 21/285 | (2006.01) | |
| H01L 29/423 | (2006.01) | |
| H01L 29/47 | (2006.01) | |
| H01L 29/66 | (2006.01) | |
| H01L 29/778 | (2006.01) | |

(52) U.S. Cl.
CPC ............... *H01L 29/68* (2013.01); *H01L 21/28* (2013.01); *H01L 21/28581* (2013.01); *H01L 21/28587* (2013.01); *H01L 29/42316* (2013.01); *H01L 29/475* (2013.01); *H01L 29/66462* (2013.01); *H01L 29/7787* (2013.01)
USPC ..... 438/579; 257/192; 257/194; 257/E21.403

(58) Field of Classification Search
CPC .. H01L 21/28; H01L 29/778; H01L 29/66431
USPC .......... 257/192, 194, 473, E21.403, E21.407, 257/E29.246; 438/579
See application file for complete search history.

(56) References Cited

U.S. PATENT DOCUMENTS

| | | | | |
|---|---|---|---|---|
| 5,300,445 | A * | 4/1994 | Oku ............................... | 438/571 |
| 5,496,748 | A * | 3/1996 | Hattori et al. ................. | 438/574 |
| 5,923,072 | A * | 7/1999 | Wada et al. .................... | 257/473 |
| 6,822,307 | B2 * | 11/2004 | Nihei et al. .................... | 257/473 |
| 7,709,310 | B2 * | 5/2010 | Markiyama et al. .......... | 438/182 |
| 7,964,486 | B2 * | 6/2011 | Watanabe et al. ............. | 438/574 |
| 2001/0046759 | A1 * | 11/2001 | Sakura .......................... | 438/573 |
| 2003/0025208 | A1 * | 2/2003 | Makiyama et al. ........... | 257/773 |
| 2008/0211052 | A1 * | 9/2008 | Watanabe et al. ............. | 257/471 |

FOREIGN PATENT DOCUMENTS

JP    2002-100639    4/2002

* cited by examiner

*Primary Examiner* — Allan R Wilson
(74) *Attorney, Agent, or Firm* — Patterson & Sheridan, LLP

(57) ABSTRACT

A semiconductor device has a gate electrode including a leg part and a canopy part. A barrier layer is formed on a bottom face of the leg part of the gate electrode. In addition, on the lower surface of the barrier layer, a Schottky metal layer with an electrode width wider than the electrode width of the barrier layer is formed to have a Schottky junction with a semiconductor layer.

20 Claims, 12 Drawing Sheets

SEMICONDUCTOR DEVICE

CROSS-REFERENCE TO RELATED APPLICATION

This application is based upon and claims the benefit of priority from Japanese Patent Application No. 2012-134913, filed Jun. 14, 2012; the entire contents of which are incorporated herein by reference.

FIELD

Embodiments described herein relate to a semiconductor device.

BACKGROUND

A gate electrode of a III-V compound HEMT (High Electron Mobility Transistor) semiconductor device mainly has a T-shaped structure. The conventional T-shaped gate electrode has an electrode structure in which a canopy part with a wide electrode width is formed on a leg part with a narrow electrode width.

The conventional T-shaped gate electrode is formed by sequentially laminating a titanium layer (Ti layer) as a Schottky electrode layer, a platinum layer (Pt layer) as a barrier layer, and a gold layer (Au layer) as a low-resistance layer. In particular, the canopy part is formed of the gold layer (Au layer) as a low-resistance layer.

However, since the barrier is laminated on the entire surface of the Schottky electrode layer, the barrier layer is exposed from the side surface of the leg part of the gate electrode. In addition, the Schottky electrode layer is generally thin. Therefore, the barrier layer, which is exposed from the side surface of the gate electrode formed, is in an adjacently contact state with respect to the semiconductor layer. Therefore, when a semiconductor device including a T-shaped gate electrode is operated, the barrier layer flows out to the semiconductor layer by heat during the operation, and the channel part right under the gate electrode is narrowed with a lapse of time. As a result, the drain to source current is decreased with a lapse of time. In other words, the life of the device is shortened.

DESCRIPTION OF THE DRAWINGS

FIG. 11A of the figure is a cross section showing the components of the gate electrode of the conventional semiconductor device, and FIG. 11B of the figure is a cross section showing the gate electrode when the conventional semiconductor device is operated.
FIG. 13A of the figure is a cross section showing the components of a gate electrode of the modified example, and FIG. 13B of the figure is a cross section showing the gate electrode when the semiconductor device having the gate electrode of the modified example is operated.
FIGS. 14 and 14B show a modified example of the gate electrode of the semiconductor device of the first embodiment.

DETAILED DESCRIPTION

The objective of the present disclosure is to provide a semiconductor device as an embodiment that can extend the life of the device.

In general, according to one embodiment, the semiconductor device of an embodiment will be explained.

This semiconductor device as an embodiment is provided with a semiconductor substrate, semiconductor layer, drain electrode, source electrode, and gate electrode. The semiconductor layer is formed on the semiconductor substrate. The drain electrode and the source electrode are formed at mutually separated positions on the surface of the semiconductor layer so that they respectively make ohmic contact with the semiconductor layer. The gate electrode is a T-shaped electrode including a leg part and a canopy part, which is formed on the leg part and has an electrode width wider than that of the leg part. In addition, this T-shaped gate electrode has a barrier layer formed on the bottom face of the leg part and a Schottky metal layer that is in contact with the lower surface of the barrier layer, has a Schottky junction with the semiconductor layer, and has an electrode width wider than that of the barrier layer.

Embodiment 1

Figure 1:
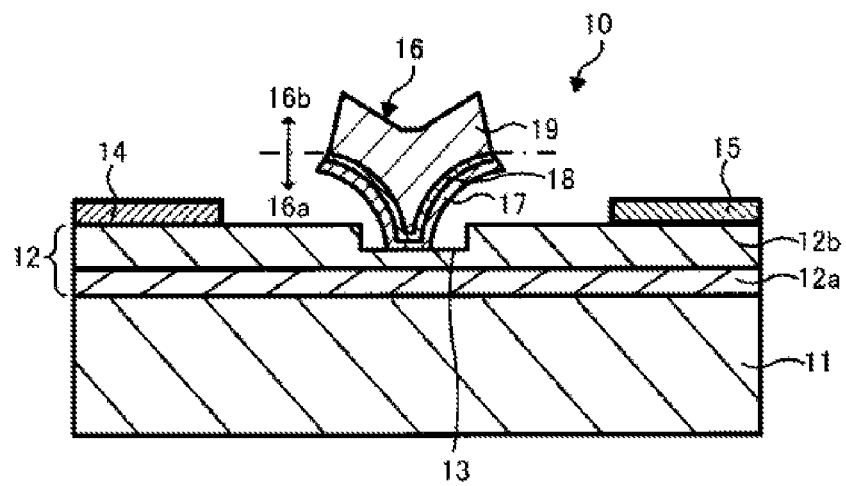
FIG. 1 is a cross section showing the semiconductor device of a first embodiment.

FIG. 1 is a cross section showing the semiconductor device of a first embodiment. As shown in FIG. 1, in a semiconductor device 10 of the first embodiment, a semiconductor layer 12 in which an electron transit layer 12a and an electron supply layer 12b are sequentially laminated on the semiconductor substrate 11 is formed. In addition, in the semiconductor layer 12, a concave recess part 13 is formed on the surface of the electron supply layer 12b.

The semiconductor substrate 11, for example, is a semi-insulating semiconductor substrate composed of GaAs. In case the semiconductor substrate 11 is GaAs, the electron transit layer 12a, for example, is composed of undoped GaAs, and the electron supply layer 12b, for example, is composed of n type AlGaAs.

On the surface of the semiconductor layer 12 except for the recess part 13, a drain electrode 14 and a source electrode 15 are formed. On the surface of the semiconductor layer 12, the drain electrode 14 and the source electrode 15 are formed at the positions where both of these electrodes sandwich the recess part 13 so that they are separated from each other.

The drain electrode 14 and the source electrode 15 respectively have a metal layer such as AuGe in ohmic contact with the electron supply layer 12b.

In addition, on the surface of the semiconductor layer 12, a gate electrode 16 is formed on the surface of the recess part 13. In other words, the gate electrode 16 is formed between the drain electrode 14 and the source electrode 15.

The gate electrode 16 is a Y-shaped electrode 16 including a leg part 16a in which the electrode width is continuously widened toward the upper part from the bottom face and the side surface is curved, and a canopy part 16b that is formed on the leg part 16a and has an electrode width wider than the bottom face of at least the leg part 16a. The bottom face of the leg part 16a contacts the semiconductor layer 12 (electron supply layer 12b) and the canopy part 16b is formed so that it is separated upward from the surface of the semiconductor layer (electron supply layer 12b).

The Y-shaped gate electrode 16 includes a Schottky metal layer 17, for example, composed of a titanium layer (Ti layer) as a metal layer, which has a Schottky junction with the electron supply part 12b, a barrier layer 18 composed of a platinum layer (Pt), and a low-resistance layer 19 composed of a gold layer (Au layer). Here, the barrier layer 18 is a layer that suppresses the diffusion of Au in the low-resistance layer 19 into the semiconductor layer 12 (electron supply layer 12b) via the Schottky metal layer 17 due to heat, so that the reliability of the device is not lowered.

Figure 2:
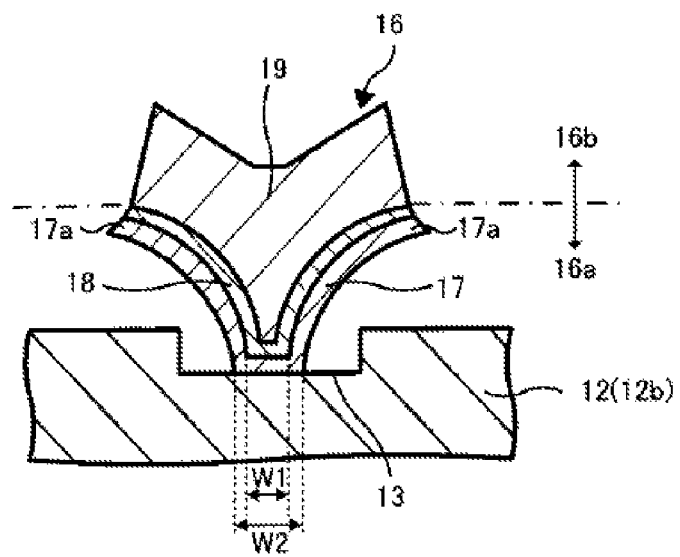
FIG. 2 is an enlarged cross section showing a gate electrode of the semiconductor device of FIG. 1.

FIG. 2 is an enlarged cross section showing the gate electrode 16. Next, the gate electrode 16 will be explained in further detail with reference to FIG. 2.

As shown in FIG. 2, the barrier layer 18 is formed on the bottom face of the leg part 16a of the gate electrode 16. The barrier layer 18 is also formed on the side surface of the leg part 16a.

In addition, the Schottky metal layer 17, part of the upper surface of which is in contact with the lower surface of the barrier layer 18 and the lower surface of which has a Schottky junction with the semiconductor layer 12 (electron supply layer 12b), is formed on the lower surface of the barrier layer 18 formed on the bottom face of the leg part 16a. In other words, on the lower surface of the barrier layer 18 with an electrode width W1, the Schottky metal layer 17 with an electrode width W2 wider than the electrode width W1 of the barrier layer is formed.

The Schottky metal layer 17 is formed so that it covers the entire lower surface of the barrier layer 18 that is formed on the side surface of the leg part 16a.

Therefore, the gate electrode 16, in which the barrier layer 18 and the Schottky metal layer 17 have been formed, is formed so that the lower surface of the Schottky metal layer 17, which is in contact with the barrier layer 18 and formed on the bottom face of the leg part 16a, contacts the surface of the recess region 13. As a result, an upper end 17a of the Schottky metal layer 17 in contact with the lower surface of the barrier layer 18 formed on the side surface of the leg part 16a is arranged upward via a prescribed space from the surface of the semiconductor layer 12.

Next, a method for manufacturing the semiconductor device 10 of this embodiment shown in FIGS. 1 and 2 will be explained with reference to FIGS. 3 to 8. FIGS. 3 to 8 are respectively cross sections showing the method for manufacturing the semiconductor device 10 of this embodiment.

Figure 3:
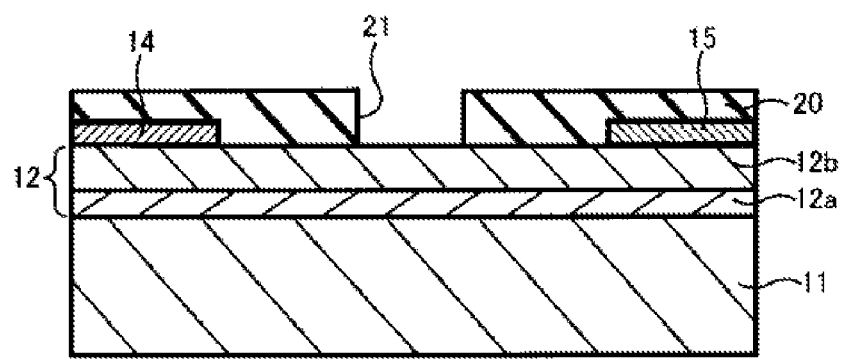
FIG. 3 is a cross section for explaining a method for manufacturing the semiconductor device of the first embodiment.

First, as shown in FIG. 3, for example, the electron transit layer 12a and the electron supply layer 12b are sequentially laminated on the surface of the semiconductor substrate 11 as a semi-insulating semiconductor substrate composed of GaAs, etc., to form the semiconductor layer 12. In addition, the drain electrode 14 and the source electrode 15 are formed on the surface of the semiconductor layer 12.

Next, a first resist layer 20 is formed on the surface of the semiconductor layer 12 including the drain electrode 14 and the source electrode 15, and a first aperture part 21 is formed in the first resist layer 20 between the drain electrode 14 and the source electrode 15.

The first aperture part 21 is formed by exposing part of the first resist layer 20 between the drain electrode 14 and the source electrode 15 through an exposure system (for example, EB (Electron Beam) image drawing) and developing the partially exposed first resist layer 20. The side surface of the first aperture part 21 formed is approximately perpendicular to the surface of the semiconductor layer 12.

Figure 4:
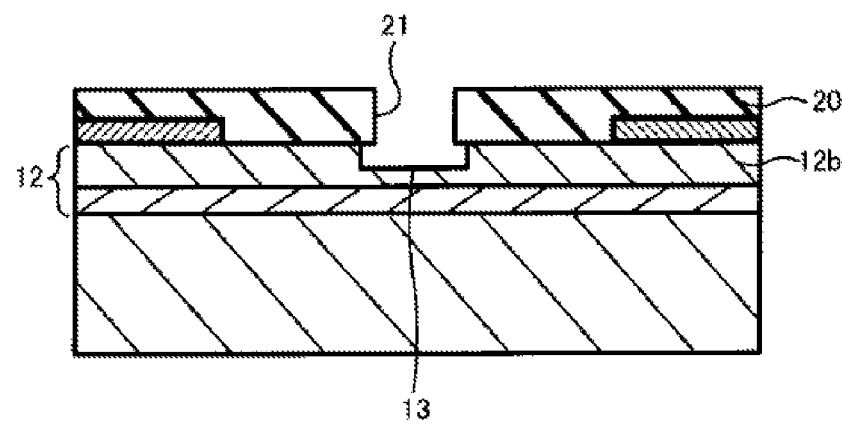
FIG. 4 is a cross section for explaining the method for manufacturing the semiconductor device of the first embodiment.

Next, as shown in FIG. 4, using the first resist layer 20 as a mask, the surface of the semiconductor layer 12, that is, the surface of the electron supply layer 12b is removed by wet-etching, forming the recess part 13 with a desired depth.

Figure 5:
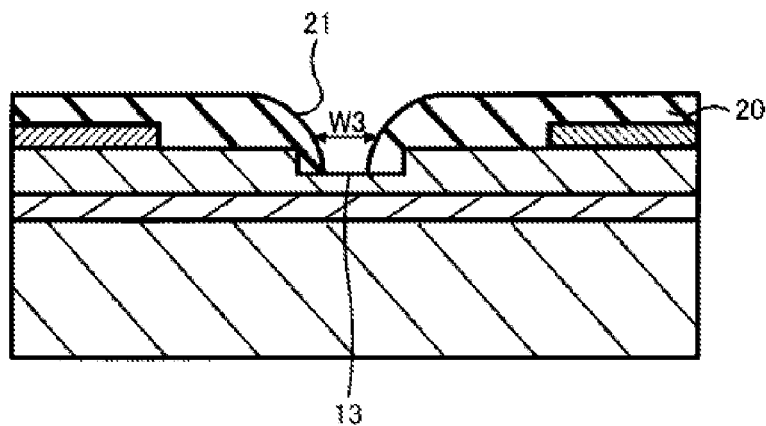
FIG. 5 is a cross section for explaining the method for manufacturing the semiconductor device of the first embodiment.

Next, the first resist layer 20 is reflowed at a desired temperature by a heat treatment. As the first resist layer 20 is heat-treated, as shown in FIG. 5, the first resist layer 20 in the vicinity of the first aperture part 21 is dropped into the recess part 13, and the side surface of the first aperture part 21 has an inclined shape. In other words, as the first resist layer 20 is heat-treated, in the first aperture part 21, the aperture diameter W3 is continuously widened toward the upper part from the lower side of the first aperture part 21, and the side surface has a curved shape.

Figure 6:
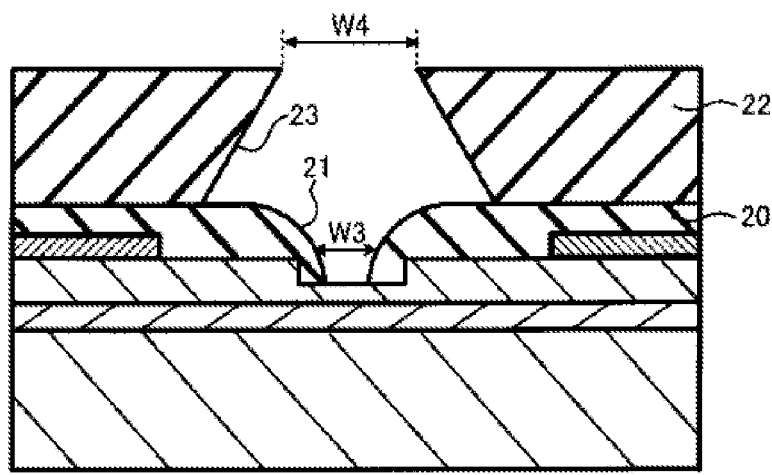
FIG. 6 is a cross section for explaining the method for manufacturing the semiconductor device of the first embodiment.

Next, as shown in FIG. 6, a second resist layer 22 having a second aperture part 23 is formed on the first resist layer 20. The second aperture part 23 is a so-called overhung aperture part in which the aperture diameter W4 of the surface part of the second resist layer 22 is smallest and the aperture diameter is widened downward from it. Since the gate electrode of this embodiment is a Y-shaped electrode, the smallest aperture diameter W4 of the second aperture part 23 is wider than the aperture diameter W3 of the first aperture part 21 of the first resist layer 20. The second resist layer 22 having the second aperture part 23 is formed so that the second aperture part 23 is arranged above the first aperture part 21 of the first resist layer 20.

Figure 7:
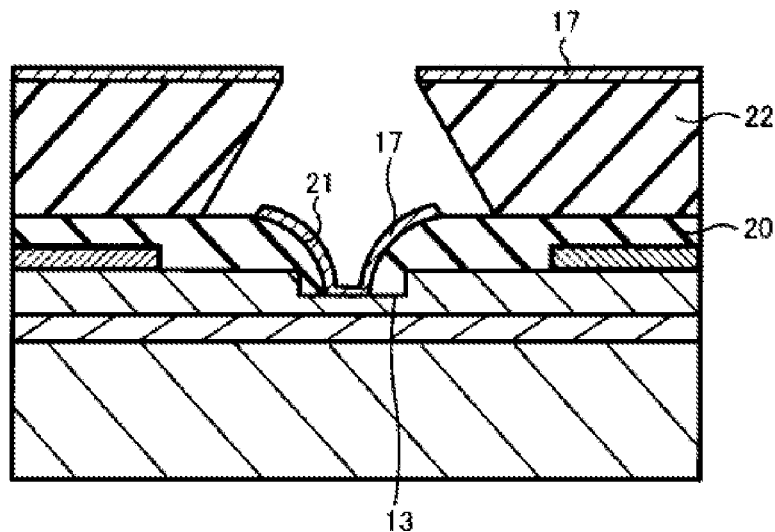
FIG. 7 is a cross section for explaining the method for manufacturing the semiconductor device of the first embodiment.

Next, as shown in FIG. 7, for example, a Ti layer is vapor-deposited as the Schottky metal layer 17 of the gate electrode from the upper side of the second resist layer 22. The Schottky metal layer 17 is formed so that it is in contact with the surface of the recess part 13, which is exposed from the first aperture part 21, and the inclined side surface of the first aperture part 21 of the first resist layer 20.

In this process, since the side surface of the first aperture part 21 of the first resist layer 20 is inclined, the Schottky metal layer 17, which is formed on the side surface of the first aperture part 21, is joined with the Schottky junction layer that is formed on the surface of the recess part 13.

Figure 8:
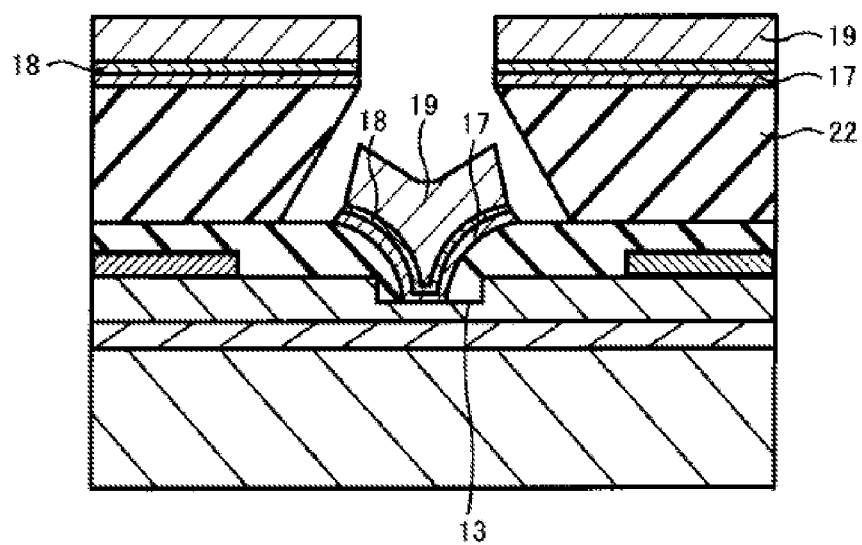
FIG. 8 is a cross section for explaining the method for manufacturing the semiconductor device of the first embodiment.

Next, as shown in FIG. 8, for example, a Pt layer as the barrier layer 18 of the gate electrode and an Au layer as the low-resistance layer 19 are sequentially vapor-deposited from the upper side of the second resist layer 22. The barrier layer 18 is laminated on the Schottky metal layer 17, and the low-resistance layer 19 is laminated on the barrier layer 18.

Finally, the Schottky metal layer 17, barrier layer 18, and low-resistance layer 19 formed on the second resist layer 22 are removed along with the second resist layer 22 and the first resist layer 20 by a lift-off method, so that the semiconductor device 10 shown in FIGS. 1 and 2 is manufactured.

According to the semiconductor device 10 of this embodiment explained above, the barrier layer 18 is formed on the bottom face and the side surface of the leg part 16a of the gate electrode 16, and the Schottky metal layer 17 is formed so that the entire lower surface of the barrier layer 18 is covered. As a result, the upper end 17a of the Schottky metal layer 17 is arranged upward via a prescribed space from the surface of the semiconductor layer 12. Therefore, the outflow of the barrier layer 18 to the semiconductor layer 12 by heat during the operation of the semiconductor device can be suppressed. As a result, the decrease of the drain to source current with a lapse of time is suppressed, thus being able to extend the life of the device.

Figure 9:
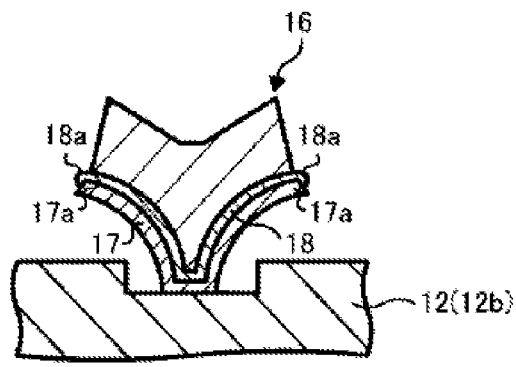
FIG. 9 is a cross section showing the gate electrode when the semiconductor device of the first embodiment is operated.

In other words, as shown in FIG. 9 which is a cross section showing the gate electrode 16 when the semiconductor device 10 of this embodiment is operated, in order for the entire surface of the lower surface of the barrier layer 18 to be covered with the Schottky metal layer 17, the barrier layer 18 flows out at the side surface of the upper end 17a of the Schottky metal layer 17 due to the heat at the time of the operation of the device. In other words, a flowed-out barrier layer 18a is formed on the side surface of the upper end 17a of the Schottky metal layer 17. However, the upper end 17a of the Schottky metal layer 17 is arranged via a desired space from the surface of the semiconductor layer 12 (electron supply layer 12b). Therefore, since the barrier layer 18a that flowed out to the upper end 17a of the Schottky metal layer 17 is suppressed from arriving at the semiconductor layer 12, the life of the device can be extended.

Figure 10:
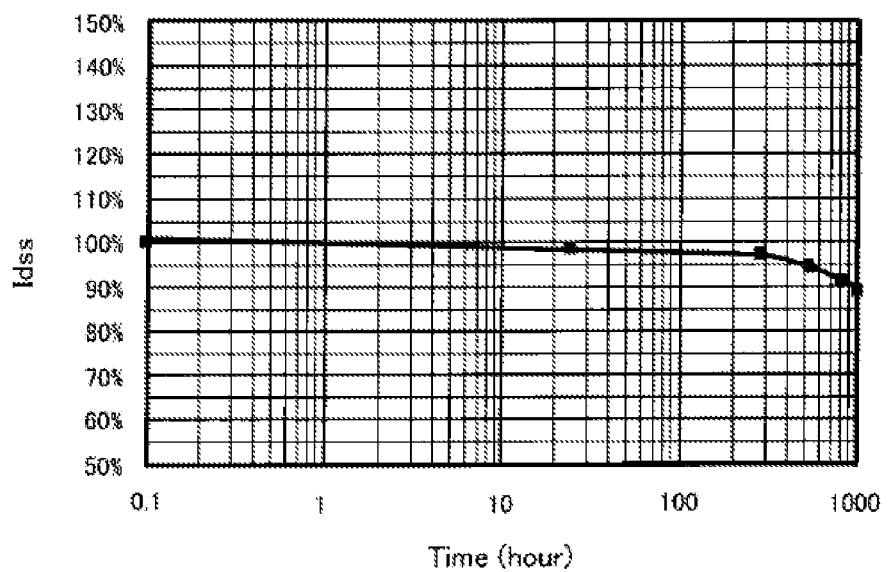
FIG. 10 is a graph showing the relationship between the drain to source current and the elapsed time in the semiconductor device of the first embodiment.

In actuality, through experiments, the inventors confirmed the change of the value of a current flowing between the drain electrode 14 and the source electrode 15 with a lapse of time, when a prescribed voltage is applied between the drain electrode 14 and the source electrode 15 of the semiconductor device 10 of this embodiment. FIG. 10 shows the results.

FIG. 10 is a graph showing the relationship between the value of the current flowing between the drain electrode 14 and the source electrode 15 (hereinafter, referred to the drain to source current) and the elapsed time in the semiconductor device 10 of the first embodiment. The abscissa indicates the elapsed time (Time (hour)), and the ordinate indicates the drain to source current (Idss). As shown in FIG. 10, according to the semiconductor device 10 of this embodiment, even if the device is continuously operated for about 100 h, the drain to source current (Idss) is little changed, and even after a continuous operation for about 1,000 h, the drain to source current (Idss) is decreased only by 10%.

Figure 11A:
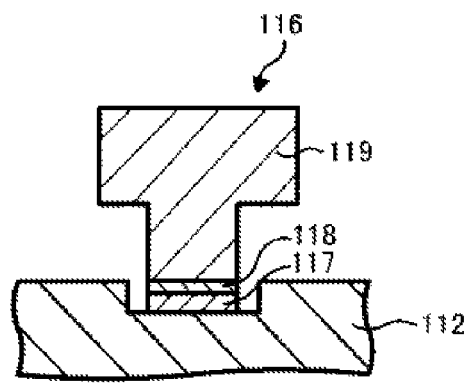
FIGS. 11A and 11B show a gate electrode of a conventional semiconductor device.
Figure 11B:
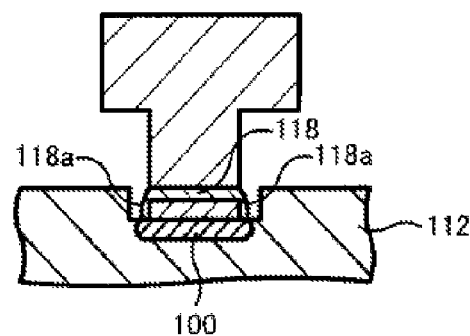

On the contrary, in the case of a conventional semiconductor device shown in FIG. 11A, in which a gate electrode 116 including Schottky junction layer 117, barrier layer 118, and low-resistance layer 119 is formed on the surface of a semiconductor layer 112, is operated, as shown in FIG. 11B, the barrier layer 118 flows out along the side surface of the gate electrode 116 by heat during the operation of the device. The flowed-out barrier layer 118a arrives at the semiconductor layer 112. As a result, a metal layer 100 is formed in the semiconductor layer 112 right under the gate electrode 116. Accordingly, the drain to source current is decreased with a lapse of time, shortening the life of the device.

Figure 12:
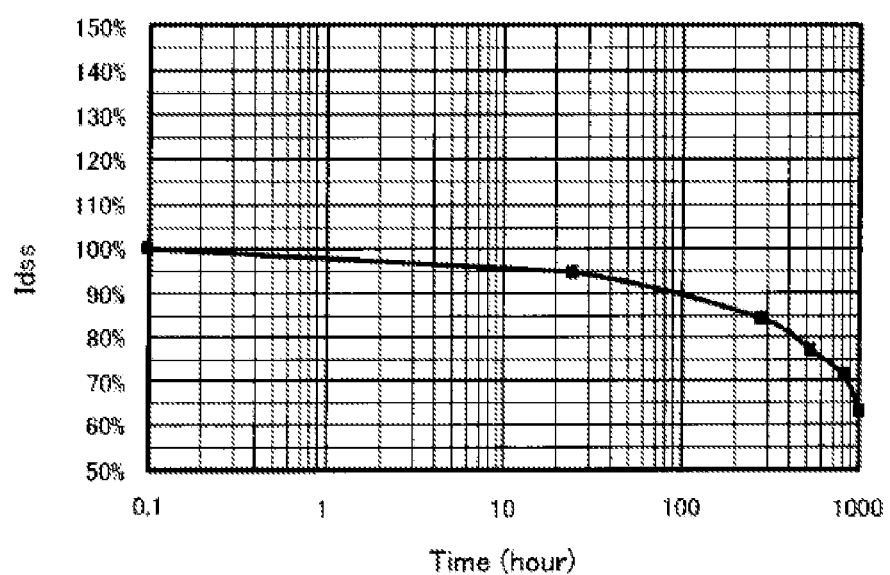
FIG. 12 is a graph showing the drain to source current and the elapsed time in the conventional semiconductor device.

In actuality, through experiments, the inventors confirmed the change of the value of the drain to source current with a lapse of time, when a prescribed voltage is applied between the drain electrode and the source electrode of the conventional semiconductor device. FIG. 12 shows the results.

FIG. 12 is a graph showing the relationship between the drain to source current and the elapsed time in the conventional semiconductor device. The abscissa indicates the elapsed time (Time (hour)), and the ordinate indicates the drain to source current (Idss). As shown in FIG. 12, according to the conventional semiconductor device, after a continuous operation for about 100 h, the drain to source current (Idss) is decreased by about 10%, and after a continuous operation for about 1,000 h, the drain to source current (Idss) is decreased by 35% or more.

As also seen from the comparison of the experimental results of FIGS. 10 and 12 explained above, according to the semiconductor device 10 of this embodiment, the barrier layer 18a that flows out of the gate electrode 16 is suppressed from arriving at the semiconductor layer 12, thus being able to extend the life of the device.

Figure 13A:
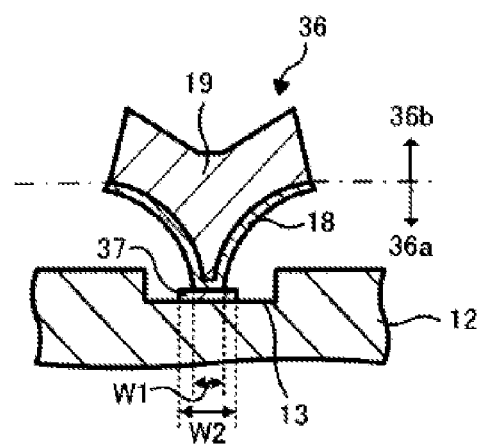
FIGS. 13A and 13B show a modified example of the gate electrode of the semiconductor device of the first embodiment.
Figure 13B:
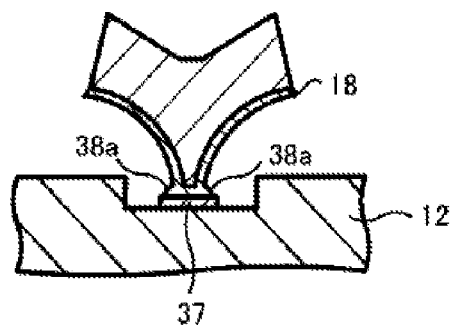
Figure 14A:
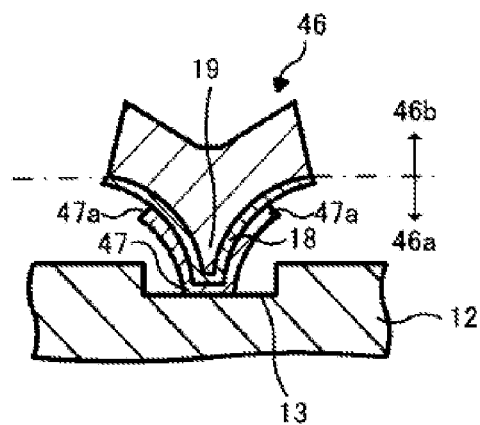
FIG. 14A of the figure is a cross section showing the components of a gate electrode of another modified example, and FIG. 14B of the figure is a cross section showing the gate electrode when the semiconductor device having the gate electrode of another modified example is operated.
Figure 14B:
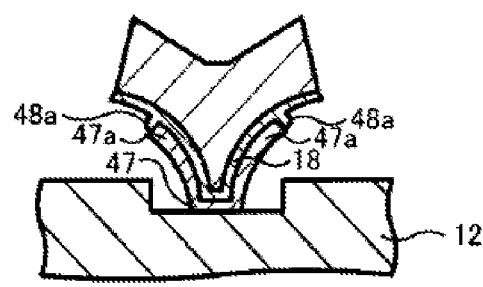

Here, in the semiconductor device of this embodiment, even if the Schottky metal layer constituting the gate electrode, for example, is formed as follow, an effect similar to that of the semiconductor device of this embodiment can be obtained. FIGS. 13A, 13B, 14A and 14B are enlarged diagrams showing modified examples of the gate electrode of the semiconductor device of this embodiment. FIGS. 13A and 14A are cross sections showing the components of gate electrodes 36 and 46 of the modified examples, and FIGS. 13B and 14B are cross sections showing the gate electrodes 36 and 46 when the semiconductor devices having the gate electrodes 36 and 46 of the modified examples are operated. Here, in FIGS. 13A, 13B, 14A and 14B, the same symbols are given to the same components as those of the gate electrode 16 shown in FIG. 2, so their explanation is omitted.

As shown in FIG. 13A, in the gate electrode 36 including a leg part 36a and a canopy part 36b, a Schottky metal layer 37 is not formed on the lower surface of the barrier layer 18 formed on the side surface of the leg part 36a, but is formed so that it is in contact with the lower surface of the barrier layer 18 provided on the bottom surface of the leg part 36a. Here, the electrode width W2 of the Schottky metal layer 37 is wider than the electrode width W1 of the barrier layer 18 formed on the side surface of the leg part 36a.

Therefore, even in the case the Schottky metal layer 37 is formed, as shown in FIG. 13B, the barrier layer 18 flows out to the surface of the Schottky metal layer 37. However, the flowed-out barrier layer 38a remains on the surface of the Schottky metal layer 37. Therefore, the flowed-out barrier layer 38a can be suppressed from arriving at the semiconductor layer 12, thus being able to extend the life of the device.

In addition, as shown in FIG. 14A, in the gate electrode 46 including a leg part 46a and a canopy part 46b, similarly to the Schottky metal layers 17 and 27 shown in FIG. 2 or FIG. 13A, a Schottky metal layer 47 is formed so that it is in contact with the lower surface of the barrier layer 18 formed on the bottom face of the leg part 46a and also formed so that it is in contact with part of the lower surface of the barrier layer 18 formed on the side surface of the leg part 46a.

Therefore, even in case the Schottky metal layer 47 is formed, as shown in FIG. 14B, the barrier layer 18 flows out to an upper end 47a of the Schottky metal layer 47. However, the upper end 47a of the Schottky metal layer 47 is arranged via a prescribed space from the surface of the semiconductor layer 12. Therefore, the barrier layer 48a that flowed out to the upper end 47a of the Schottky metal layer 47 is suppressed from arriving at the semiconductor device 12, thus being able to extend the life of the device.

Embodiment 2

Figure 15:
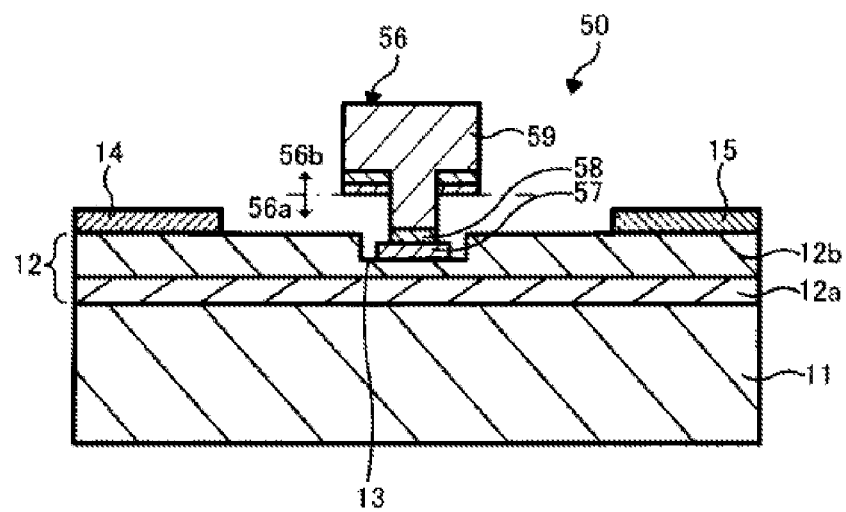
FIG. 15 is a cross section showing the semiconductor device of a second embodiment.

FIG. 15 is a cross section showing the semiconductor device of a second embodiment. As shown in FIG. 15, a semiconductor device 50 of the second embodiment is different in the gate electrode 56, compared with the semiconductor device 10 of the first embodiment, and the other components are the same. Therefore, in the following explanation of the semiconductor device 50 of the second embodiment, the same symbols are given to the same parts as those of the semiconductor device 10 of the first embodiment, and their explanation is omitted.

In the semiconductor device 50 of the second embodiment, the gate electrode 56 is a T-shaped gate electrode 56 including a leg part 56a with a fine electrode width and a canopy part 56b that is formed on the leg part 56a and has an electrode width wider than that of the leg part 56a. The bottom face of the leg part 56a contacts the semiconductor layer 12 (electron supply layer 12b), and the canopy part 56b is formed so that it is separated upward from the surface of the semiconductor layer (electron supply layer 12b).

The T-shaped gate electrode 56, for example, includes Schottky metal layer 57 composed of a titanium layer (Ti layer) as a metal having a Schottky Junction with the electron supply layer 12b, barrier layer 58 composed of a platinum layer (Pt), and low-resistance layer 59 composed of a gold layer (Au layer).

Figure 16:
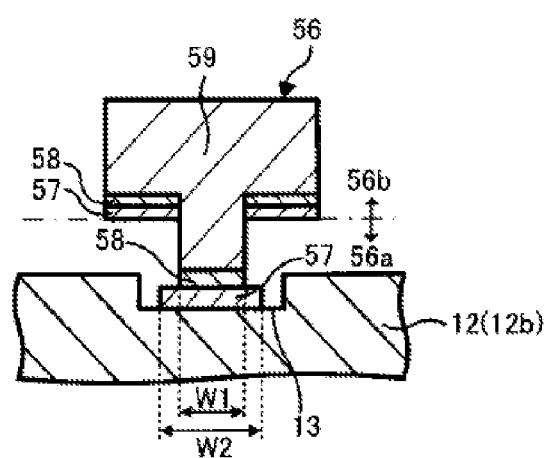
FIG. 16 is an enlarged cross section showing a gate electrode of the semiconductor device of FIG. 15.

FIG. 16 is an enlarged cross section showing the gate electrode 56. Next, the gate electrode 56 will be explained in further detail with reference to FIG. 16.

As shown in FIG. 16, the barrier layer 58 is formed on the bottom face of the leg part 56a of the gate electrode 56. In addition, the Schottky metal layer 57, part of the upper surface of which contacts the lower surface of the barrier layer 58 and the lower surface of which has a Schottky junction with the semiconductor layer 12 (electron supply layer 12b), is formed on the lower surface of the barrier layer 58. In other words, on the lower surface of the barrier layer 58 with an electrode width W1 formed on the bottom face of the leg part 56a, the Schottky metal layer 57 with an electrode width W2 wider than the electrode width W1 of the barrier layer is formed.

The gate electrode 56, in which the barrier layer 58 and the Schottky metal layer 57 are formed in this manner, is formed so that the lower surface of the Schottky metal layer 57 is in contact with the surface of the recess region 13.

Here, the barrier layer 58 and the Schottky metal layer 57 are also formed on the lower surface of the canopy part 56b of the gate electrode 56; however, the barrier layer 58 and Schottky metal layer 57 are formed on the lower surface of the canopy part 56b for convenience of manufacture and are not necessarily required for the gate electrode 56.

Figure 17:
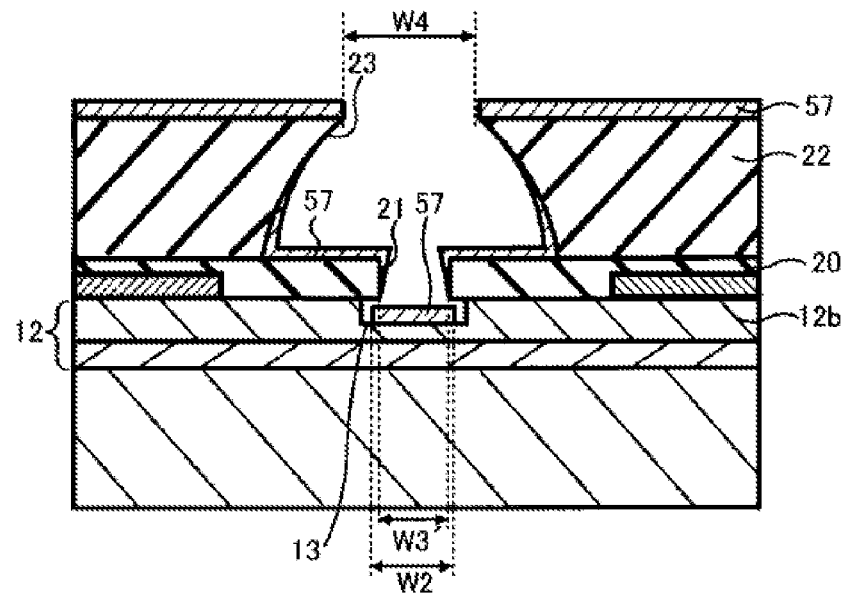
FIG. 17 is a cross section for explaining a method for manufacturing the semiconductor device of the second embodiment.
Figure 18:
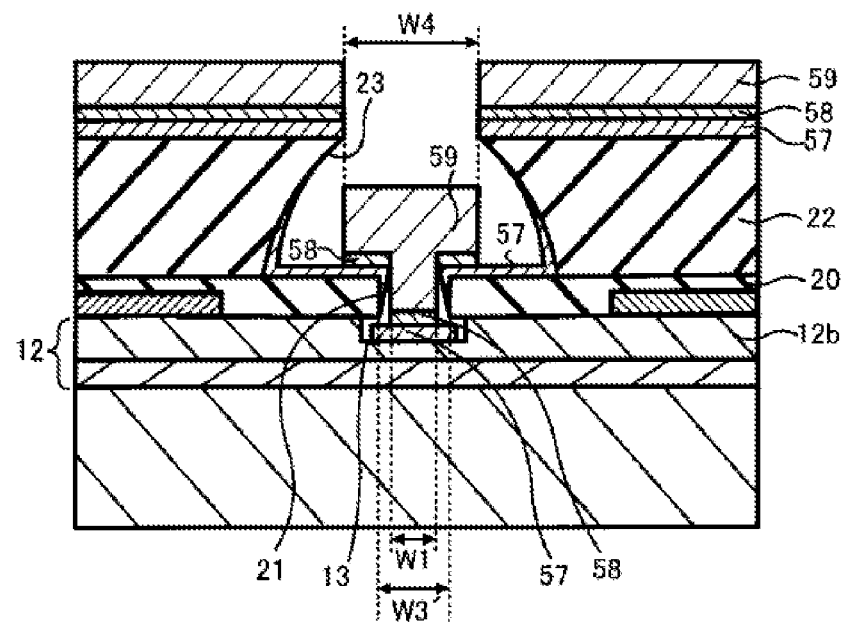
FIG. 18 is a cross section for explaining the method for manufacturing the semiconductor device of the second embodiment.

Next, a method for manufacturing the semiconductor device 50 of the second embodiment shown in FIGS. 15 and 16 will be explained with reference to FIGS. 17 and 18. FIGS. 17 and 18 are respectively cross sections for explaining the method for manufacturing the semiconductor device 50 of the second embodiment.

Here, compared with the method for manufacturing the semiconductor device 10 of the first embodiment, the method for manufacturing the semiconductor device 50 is the same as the method for manufacturing the semiconductor device of the first embodiment except that the first resist layer 20 does not undergo a reflow treatment until the process (FIG. 6) for forming the second resist layer 22 having the second aperture part 23. Therefore, in the following explanation of the method for manufacturing the semiconductor device 50 of the second embodiment, the processes after forming the second resist layer 22 will be explained.

On the first resist layer 20 on which the first aperture part 21 with an aperture diameter of W3' is formed without a reflow treatment, the second resist layer 22 having an overhung second aperture part 23 with the smallest aperture diameter of W4 (>W3') is formed, and as shown in FIG. 17, for example, a Ti layer is vapor-deposited as the Schottky metal layer 57 of the gate electrode from the upper side of the second resist layer 22 by a so-called planeta technique. In other words, a metal as the Schottky metal layer 57 is vapor-deposited from an oblique direction.

In this process, the Schottky metal layer 57 is formed on the surface of the recess part 13; however, since the Schottky metal layer 57 is formed by vapor-depositing the metal from an oblique direction, the electrode width W2 of the Schottky meta layer 57 formed is wider than the aperture diameter W3' of the first aperture part 21.

Here, since the Schottky metal layer 57 is formed from an oblique direction by the vapor deposition, it is formed on the surface of the first resist layer 20, the side surface of the first aperture part 21, the surface of the second resist layer 22, and the side surface of the second aperture part 23.

Next, as shown in FIG. 18, for example, a Pt layer is vapor-deposited as the barrier layer 58 of the gate electrode from the upper side of the second resist layer 22 by a so-called vertical technique. In other words, the metal as the barrier layer 58 is vapor-deposited from the vertical direction.

In this process, the barrier layer 58 is formed by vapor-depositing the metal from the vertical direction, and it is formed at an electrode width W1 approximately matching with the aperture diameter W3' of the first aperture part 21 on the Schottky metal layer 57.

Here, since the aperture diameter W4 of the second aperture part 23 on the surface of the second resist layer 22 is wider than the aperture diameter W3' of the first aperture part 21 of the first resist layer 20, the barrier 58 is also formed on part of the surface of the first resist layer 20 that is exposed in the second aperture part 23.

Here, the approximate matching does not mean complete matching. In other words, in the preprocess for forming the barrier layer 58, the metal as the Schottky metal layer 57 is vapor-deposited from an oblique direction. Therefore, the very thin Schottky metal layer 57 is formed on the side surface of the first aperture part 21 of the first resist layer 20. Therefore, when the barrier layer 58 is formed, the aperture diameter of the first aperture part 21 is slightly narrower than W3' in actuality. As a result, the electrode width W1 of the barrier layer 58 to be formed is slightly narrower than the aperture diameter W3' of the first aperture part 21.

Next, for example, an Au layer is vapor-deposited as the low-resistance layer 59 of the gate electrode from the upper side of the second resist layer 22 by the so-called vertical technique. Therefore, the low-resistance layer 59 with an electrode width of W1 as the leg part of the gate electrode and the low-resistance layer 59 with an electrode width of W4 as the canopy part of the gate electrode are formed on the barrier layer 58.

Finally, the unnecessary Schottky metal layer 57, barrier layer 58, and low-resistance layer 59 are removed along with the second resist layer 22 and the first resist layer 20 by the lift-off method, so that the semiconductor device 50 shown in FIGS. 15 and 16 is manufactured.

According to the semiconductor device 50 of this embodiment explained above, the Schottky metal layer 57 with an electrode width wider than that of the barrier layer 58 is formed on the lower surface of the barrier layer 58. Therefore, the outflow of the barrier layer 58 to the semiconductor layer 12 by heat during the operation of the semiconductor device can be suppressed. Consequently, the problem that a current flowing between the drain electrode and the source electrode becomes small with time is reduced, and a life time of the semiconductor device can lengthen.

Figure 19:
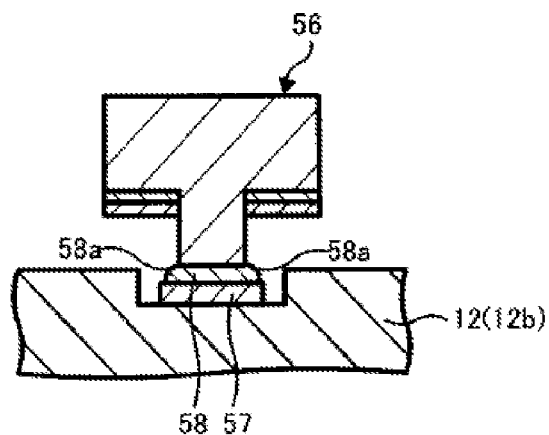
FIG. 19 is a cross section showing the gate electrode when the semiconductor device of the second embodiment is operated.

In other words, as shown in FIG. 19 that is a cross section showing the gate electrode 56 when the semiconductor device 50 of this embodiment is operated, since the Schottky metal layer 57 with an electrode width wider than that of the barrier layer 58 is formed on the lower surface of the barrier layer 58, the barrier layer 58 flows out to the surface of the Schottky metal layer 57 by heat during the operation of the device. However, the flowed-out barrier layer 58a remains on the surface of the Schottky metal layer 57. Therefore, the flowed-out barrier layer 58a can be suppressed from arriving at the semiconductor layer 12, thus being able to extend the life of the device.

Figure 20:
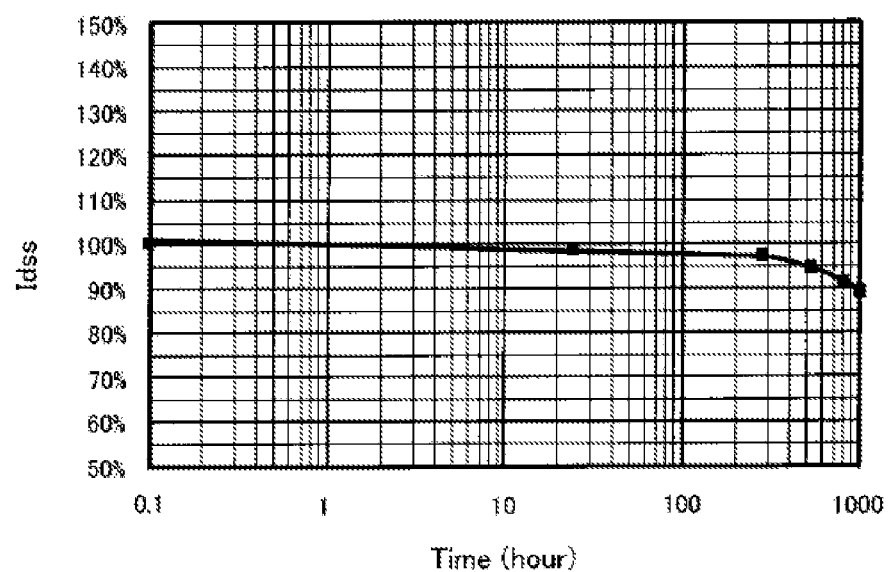
FIG. 20 is a graph showing the relationship between the drain to source current and the elapsed time in the semiconductor device of the second embodiment.

In actuality, through experiments, the inventors confirmed the change of the value of a current flowing between the drain electrode 14 and the source electrode 15 with a lapse of time, when a prescribed voltage is applied between the drain electrode 14 and the source electrode 15 of the semiconductor device 50 of this embodiment. FIG. 20 shows the results.

FIG. 20 is a graph showing the relationship between the drain to source current and the elapsed time in the semiconductor device 50 of this embodiment. The abscissa indicates the elapsed time (Time (hour)), and the ordinate indicates the drain to source current (Idss). As shown in FIG. 20, according to the semiconductor device 50 of this embodiment, even if the device is continuously operated for about 100 h, the drain to source current (Idss) is little changed, and even after a continuous operation for about 1,000 h, the drain to source current (Idss) is decreased only by 10%.

As also seen from the comparison of FIG. 20 explained above and FIG. 12 showing the change of the drain to source current in the conventional semiconductor device with a lapse of time, according to the semiconductor device 50 of this embodiment, the barrier layer 58a flowed out of the gate electrode 56 is also suppressed from arriving at the semiconductor layer 12, thus being able to extend the life of the device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer;
   a drain electrode and a source electrode formed in mutually separated positions on a surface of the semiconductor layer and respectively make ohmic contact with the semiconductor layer; and
   a gate electrode comprising a leg part and a canopy part provided on top of the leg part and having a width wider than that of the leg part, the gate electrode further comprising a barrier layer formed on the bottom face of the leg part and a Schottky metal layer that is in contact with a lower surface of the barrier layer and forms a Schottky junction with the semiconductor layer,
   wherein the Schottky metal layer that forms the Schottky junction is wider than the barrier layer formed on the bottom face of the leg part, and
   the gate electrode is Y-shaped.

2. The semiconductor device according to claim 1, wherein the Schottky metal layer comprises titanium.

3. The semiconductor device according to claim 1, wherein side surfaces of the gate electrode are curved.

4. The semiconductor device according to claim 3, wherein the barrier layer is also formed on the curved side surfaces of the gate electrode, and the barrier layer has curved side surfaces.

5. The semiconductor device according to claim 4, wherein the barrier layer covers the curved side surfaces of the gate electrode entirely.

6. The semiconductor device according to claim 5, wherein the Schottky junction layer is also formed on the barrier layer that covers the curved side surfaces of the gate electrode, and the Schottky junction layer has curved side surfaces.

7. The semiconductor device according to claim 4, wherein the Schottky junction layer covers the curved side surfaces of the barrier layer partially.

8. The semiconductor device according to claim 1, wherein the semiconductor layer has a recess portion and the Schottky metal layer is formed on the recess portion.

9. The semiconductor device according to claim 8, wherein the width of the canopy part is larger than the width of the recess portion.

10. A semiconductor device, comprising:
    a semiconductor layer;
    a drain electrode and a source electrode formed on a surface of the semiconductor layer; and
    a gate electrode including a metal layer having curved side surfaces, an upper portion, and a bottom portion that is narrower than the top portion, a Schottky metal layer that forms a Schottky junction with the semiconductor layer, and a barrier layer formed between the Schottky metal layer and the bottom face of the bottom portion,
    wherein the Schottky metal layer that forms the Schottky junction is wider than the barrier layer formed on the bottom face of the bottom portion, and
    the gate electrode is Y-shaped.

11. The semiconductor device according to claim 10, wherein the barrier layer is also formed on the curved side surfaces of the metal layer, and the barrier layer has curved side surfaces.

12. The semiconductor device according to claim 11, wherein the barrier layer covers the curved side surfaces of the metal layer entirely.

13. The semiconductor device according to claim 12, wherein the Schottky junction layer is also formed on the barrier layer that covers the curved side surfaces of the metal layer, and the Schottky junction layer has curved side surfaces.

14. The semiconductor device according to 11, wherein the Schottky junction layer covers the curved side surfaces of the barrier layer partially.

15. The semiconductor device according to claim 10, wherein the semiconductor layer has a recess portion and the Schottky metal layer is formed on the recess portion.

16. The semiconductor device according to claim 15, wherein the width of the canopy part is larger than the width of the recess portion.

17. A method of manufacturing a semiconductor device, comprising:
  forming a semiconductor layer on a semiconductor substrate;
  forming drain and source electrodes on a surface of the semiconductor layer;
  forming a recess portion on the semiconductor layer;
  forming a Schottky metal layer that forms a Schottky junction with the semiconductor layer at the recess portion;
  forming a barrier layer on the Schottky metal layer; and
  forming a metal layer on the barrier layer,
  wherein the Schottky metal layer that forms the Schottky junction is wider than the barrier layer formed on a bottom face of the metal layer, and
  the Schottky metal layer, the barrier layer, and the metal layer form a Y-shaped electrode.

18. The method of claim 17, wherein the Schottky metal layer, the barrier layer, and the metal layer are formed with curved side surfaces.

19. The method of claim 17, wherein the barrier layer covers the curved side surfaces of the metal layer entirely.

20. The method of claim 17, wherein the Schottky junction layer covers the curved side surfaces of the barrier layer partially.

* * * * *